United States Patent
Pirk et al.

(10) Patent No.: US 8,847,336 B2
(45) Date of Patent: Sep. 30, 2014

(54) MICROMECHANICAL COMPONENT HAVING AN INCLINED STRUCTURE AND CORRESPONDING MANUFACTURING METHOD

(75) Inventors: Tjalf Pirk, Stuttgart (DE); Stefan Pinter, Reutlingen (DE); Hubert Benzel, Pliezhausen (DE); Heribert Weber, Nuertingen (DE); Michael Krueger, Reutlingen (DE); Robert Sattler, Regensberg (DE); Frederic Njikam Njimonzie, Reutlingen (DE); Joerg Muchow, Reutlingen (DE); Joachim Fritz, Tuebingen (DE); Christoph Schelling, Stuttgart (DE); Christoph Friese, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 278 days.

(21) Appl. No.: 12/937,093

(22) PCT Filed: Nov. 28, 2008

(86) PCT No.: PCT/EP2008/066388
§ 371 (c)(1),
(2), (4) Date: Feb. 25, 2011

(87) PCT Pub. No.: WO2009/124605
PCT Pub. Date: Oct. 15, 2009

(65) Prior Publication Data
US 2011/0147862 A1  Jun. 23, 2011

(30) Foreign Application Priority Data
Apr. 8, 2008 (DE) .......... 10 2008 001 038

(51) Int. Cl.
*H01L 29/788* (2006.01)
*B81C 1/00* (2006.01)

(52) U.S. Cl.
CPC ..... *B81C 1/00103* (2013.01); *B81B 2203/0118* (2013.01); *B81B 2203/0307* (2013.01)
USPC 257/415; 257/420; 257/E31.11; 257/E21.502

(58) Field of Classification Search
USPC ............... 428/156; 216/22; 257/415–420, 257/E31.11, E21.502, E29.324, E29.325
See application file for complete search history.

(56) References Cited

U.S. PATENT DOCUMENTS

| | | | | |
|---|---|---|---|---|
| 5,893,723 | A | * | 4/1999 | Yamanaka ............. 438/65 |
| 2001/0021570 | A1 | * | 9/2001 | Lin et al. ............. 438/455 |

(Continued)

FOREIGN PATENT DOCUMENTS

| | | |
|---|---|---|
| JP | 2003-506873 | 2/2003 |
| JP | 2003-307483 | 10/2003 |
| EP | 1351256 | 10/2003 |
| FR | 2880731 | 7/2006 |

(Continued)

OTHER PUBLICATIONS

International Search Report for PCT/EP2008/066388, dated Feb. 4, 2010.

*Primary Examiner* — Michael Shingleton
(74) *Attorney, Agent, or Firm* — Kenyon & Kenyon LLP

(57) ABSTRACT

In a micromechanical component having an inclined structure and a corresponding manufacturing method, the component includes a substrate having a surface; a first anchor, which is provided on the surface of the substrate and which extends away from the substrate; and at least one cantilever, which is provided on a lateral surface of the anchor, and which points at an inclination away from the anchor.

15 Claims, 3 Drawing Sheets

(56) References Cited

U.S. PATENT DOCUMENTS

| | | | |
|---|---|---|---|
| 2007/0194656 A1* | 8/2007 | Takayanagi et al. | 310/307 |
| 2008/0050561 A1 | 2/2008 | Joisten et al. | |
| 2008/0194053 A1* | 8/2008 | Huang | 438/53 |
| 2011/0147862 A1* | 6/2011 | Pirk et al. | 257/418 |

FOREIGN PATENT DOCUMENTS

| | | |
|---|---|---|
| JP | 2005-122146 | 5/2005 |
| JP | 2005-353333 | 12/2005 |
| JP | 2009-34779 | 2/2009 |
| WO | WO 01/09952 | 2/2001 |

* cited by examiner

MICROMECHANICAL COMPONENT HAVING AN INCLINED STRUCTURE AND CORRESPONDING MANUFACTURING METHOD

FIELD OF THE INVENTION

The present invention relates to a micromechanical component having an inclined structure. The present invention also relates to a corresponding manufacturing method.

BACKGROUND INFORMATION

Modern semiconductor technology is largely based on the application and structuring of layers. Highly complex structures are possible using clever process sequences.

The degree of complexity of micromechanical components, such as sensors and actuators, has increased significantly in recent years. The recurring problem in this context is to cost-effectively and reliably manufacture components having inclined structures or round structures.

The introduction of inclined planes or round structures ("bumps" or "dents") on or in micromechanical layers is not a high volume method, however. Such structures may be manufactured using grayscale lithography, but the processes are very sensitively dependent on the process parameters and are not suitable for high volumes. Anisotropic etching (e.g., silicon in KOH, TMAH) does not allow design freedom, because only very specific angles are possible.

SUMMARY

The micromechanical component having an inclined structure according to example embodiments of the present invention having the features described herein and the corresponding manufacturing method described herein have the advantage that they allow simple manufacturing of a micromechanical component having an inclined structure. An inclined structure according to example embodiments of the present invention is not restricted to a completely linear inclination, but rather also includes a partially linear inclination and a rounded inclination. In other words, inclined means that the cantilever has a tangent at least one point on its surface which does not form a right angle to the lateral surface of the first anchor.

Starting from an anchor structure having at least one cantilever located thereon, an aspect hereof is to induce bending of the cantilever such that it points at an inclination away from the anchor. Connection in the inclined position may be achieved either by a connection procedure, such as bonding or gluing, or by irreversible freezing of an internal stress in the cantilever, e.g., by quenching.

Example embodiments of the present invention provide a combination of methods via which inclined bars or planes may be permanently manufactured. Applications may be seen, for example, in microfluidics, actuators, or sensors. The manufacturing is performed using standard processes and may therefore also be modeled so that it is suitable for high volume. Example embodiments of present invention allow a structure manufactured in one layer, such as a bar, to be bent in a targeted manner using suitable steps (for example, using a stress induced by further layers or inherent stress, pressure, or electrostatic attraction, or by combination of various methods) and subsequently, or preferably in the bending process step, to be connected directly or via an anchor to a suitable substrate. The structure is thus connected out of the plane and may supplement the mode of operation of the further micromechanics.

Example embodiments of the present invention allow the structuring of a plane having an effect in various planes. It requires less structuring effort than conventional techniques, which allows a cost savings, a yield advantage, and better functionality due to less adjustment offset. Therefore, higher signals and/or forces may be achieved by better arrangement of the structures, better functionality, and more flexible overall sizes. An example is improved fluidic functionality due to smoother transitions between various levels.

According to example embodiments, the cantilever points at an inclination downward toward the surface of the substrate.

The cantilever may be connected directly to the surface of the substrate or indirectly, for example, via a second anchor or another connection structure.

The anchor and the cantilever may be implemented in one piece, for example, from a micromechanical silicon structure.

In example embodiments, a first anchor and a second anchor are provided spaced apart from one another by an intermediate space on the surface of the substrate, the anchors being connected to the surface of the substrate via a particular cantilever, a suspension for a rotational axis of a rotating bar being attached to the anchors in the intermediate space.

The cantilever may assume various forms, and may be bar-shaped or planar in particular (for example, shield-like, in the form of a circular segment, triangular, etc.).

Exemplary embodiments of the present invention are shown in the drawings and are explained in greater detail in the following description.

DETAILED DESCRIPTION

Figure 1A:
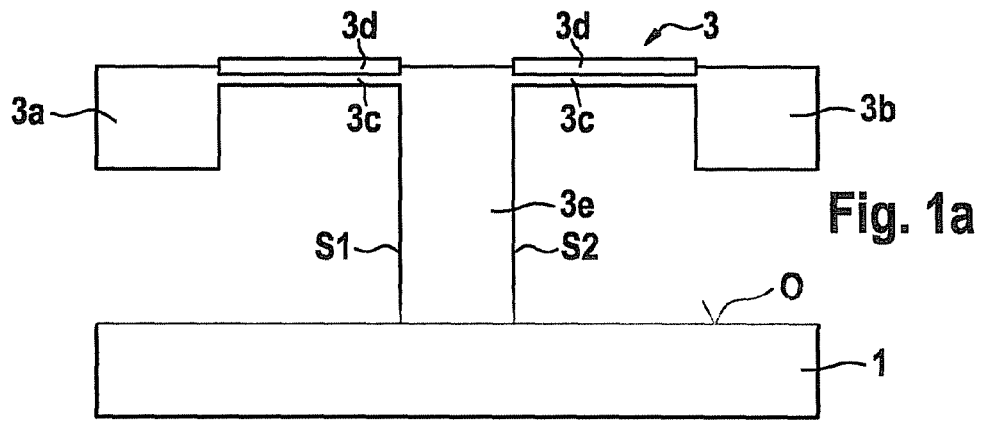
FIGS. 1a-c show schematic cross-sectional views of a micromechanical component according to an example embodiment of the present invention.

Identical reference numerals refer to identical or functionally identical components in the figures.

Figure 1B:
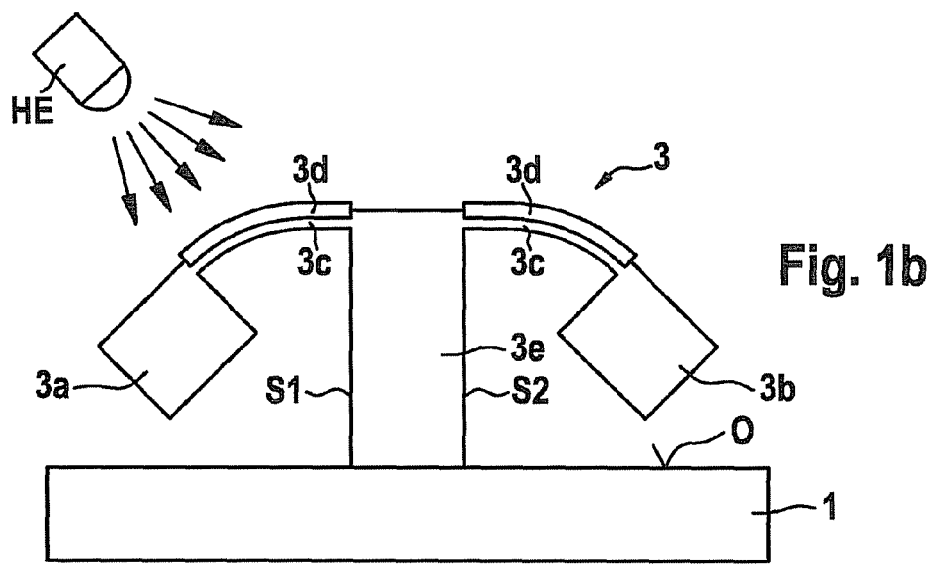
Figure 1C:
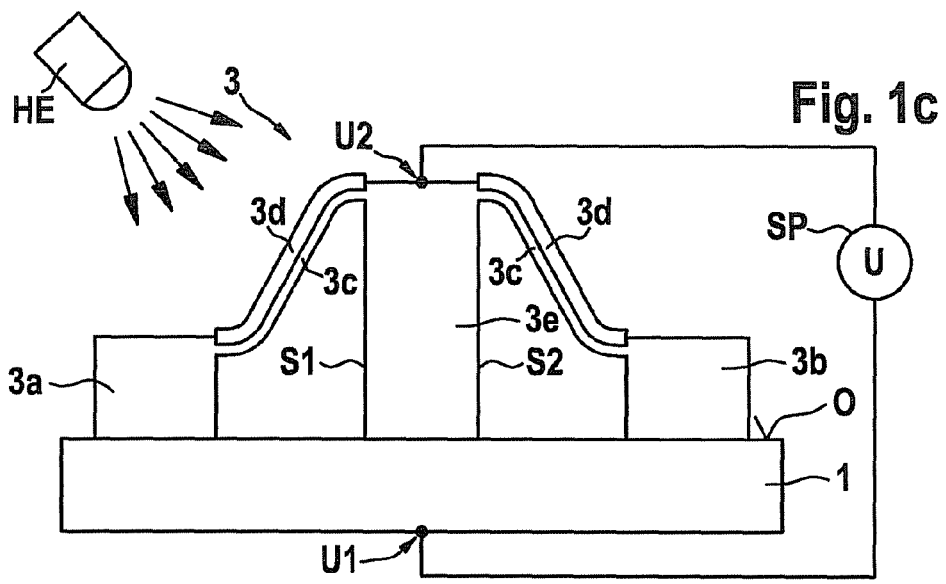

FIGS. 1a-c are schematic cross-sectional views of a micromechanical component according to an example embodiment of the present invention.

In FIGS. 1a-c, reference numeral 1 refers to a borofloat substrate. A first anchor 3e is provided on a surface O of substrate 1, the anchor extending away in a column from substrate 1. Two thin cantilevers 3c are provided in one piece with anchor 3e on its side walls S1, S2, a second anchor 3a and 3b being provided at each end of the cantilevers. A particular metal coating area 3d, for example, made of aluminum, is additionally provided on cantilevers 3c. In the present example, first anchor 3e, cantilevers 3c, and second anchors 3a and 3b are produced in one piece from silicon, for example, by a corresponding etching process employing a corresponding sacrificial layer. Metal layer areas 3d are provided, for example, by deposition and back-etching on cantilevers 3c. First anchor 3e, cantilevers 3c having metal layer areas 3d, and second anchors 3a and 3b thus form a T-structure in the present example.

By suitably selecting the relevant coefficients of thermal expansion of cantilevers 3c and metal layer areas 3d, the cantilevers may be provided with a semiconductor/metal bimorphic characteristic, i.e., the possibility of bending by application of temperature.

Starting from the structure described with reference to FIG. 1a, according to FIG. 1b, heat is discharged to the T-structure using a heating unit HE, metal layer areas 3d on cantilevers 3c expanding to a greater extent than cantilevers 3c by appropriate selection of the coefficient of thermal expansion.

Finally, with reference to FIG. 1c, second anchors 3a, 3b touch surface O of substrate 1, and in a manner which may be predefined by the geometry of second anchors 3a, 3b and the design of cantilevers 3c and metal layer areas 3d. In their structuring, it is to be ensured that the movement occurs in a controlled manner from the starting position and bending in undesired directions is not possible.

After second anchors 3a, 3b rest positively on substrate 1 according to FIG. 1c, these anchors may be connected to substrate 1 using suitable measures. It is shown as an example in FIG. 1c that this connection is performed by anodic bonding with the aid of a voltage source SP, which applies a voltage U on the one hand at point U1 to substrate 1 and on the other hand at point U2 to first anchor 3e. A suitable material combination for this purpose is the described material combination of silicon anchor and borofloat substrate. The fact that both the temperature action of heating unit HE and the electrostatic attraction by applied voltage U support the bending of cantilever 3c may additionally be advantageously employed.

It is to be noted that other types of measures, such as seal glass bonding, gluing, etc., are also possible, as is local activation, for example, by electrical heating elements on second anchors 3a, 3b.

Figure 2:
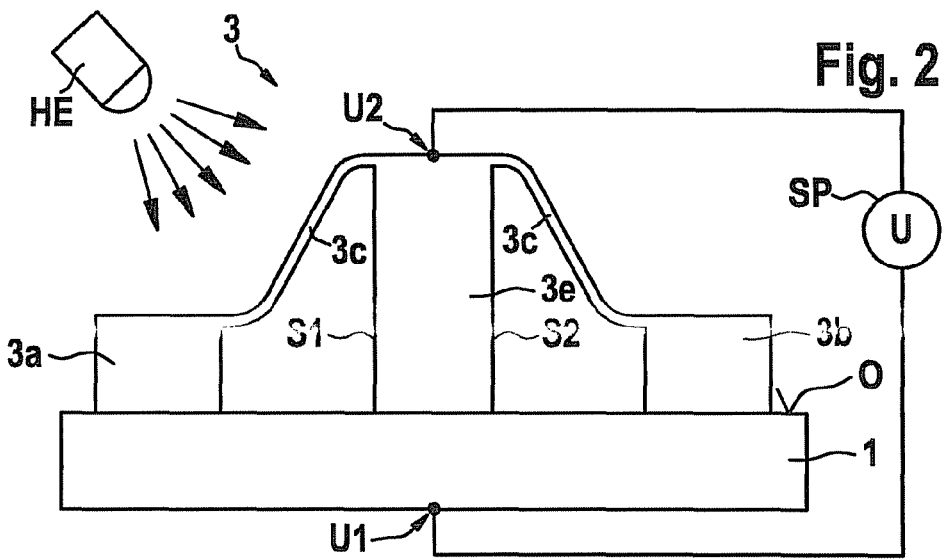
FIG. 2 shows a schematic cross-sectional view of a micromechanical component according to an example embodiment of the present invention.

FIG. 2 is a schematic cross-sectional view of a micromechanical component according to an example embodiment of the present invention.

In the example embodiment according to FIG. 2, metal layer areas 3d from FIG. 1 are omitted. In this example, the heating of cantilevers 3c provided by heating unit HE only causes material softening, and the bending occurs under the influence of gravity and under the influence of the electrostatic attractive force between substrate 1 and second anchors 3a, 3b, which is caused by applied voltage U.

Figure 3A:
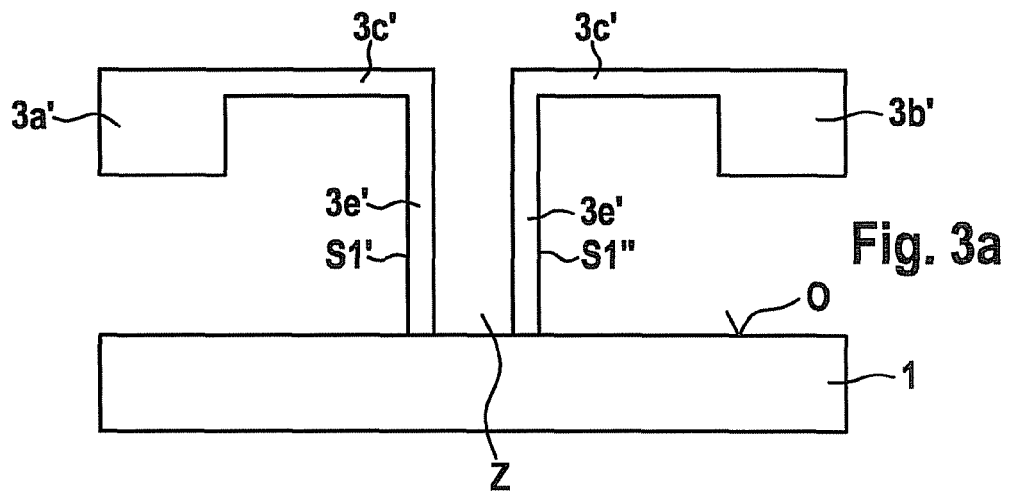
FIGS. 3a, b show schematic cross-sectional views of a micromechanical component according to an example embodiment of the present invention.
Figure 3B:
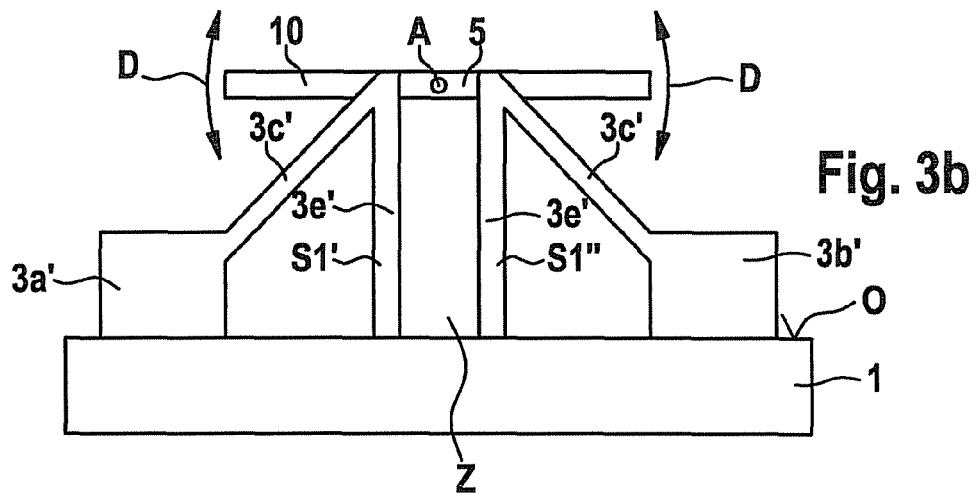

FIGS. 3a, b are schematic cross-sectional views of a micromechanical component according to an example embodiment of the present invention.

In contrast to the above-described example embodiments, the example embodiment according to FIGS. 3a, b does not start from a T-shaped basic structure, but rather from two gallows-shaped basic structures, which are provided on substrate 1 spaced apart from one another by an intermediate space Z. In particular, reference numeral 3e' refers to the two first anchors, on whose side walls S1' and S1 2' a cantilever 3c' is provided in each case. Associated second anchors 3a' and 3b' are located at each end of cantilevers 3c'.

Second anchors 3a' and 3b' are brought into contact with surface O of substrate 1 and fixedly connected thereto by a method which has already been described in connection with FIGS. 1 and 2.

A suspension 5 for a rotational axis A of a rotating bar 10 is subsequently implemented in intermediate space Z. This suspension may be detached from anchors 3e', in order to apply different potentials to rotational axis A and inclined structures 3e', 3c', 3a' or 3e', 3c', 3b', but may also be attached to anchors 3e'. Inclined structure 3e', 3c', 3a' or 3e', 3c', 3b' thus ensures solid support of suspension 5 for rotating bar 10, which is rotatable along rotational direction D like a windmill vane.

Figure 4:
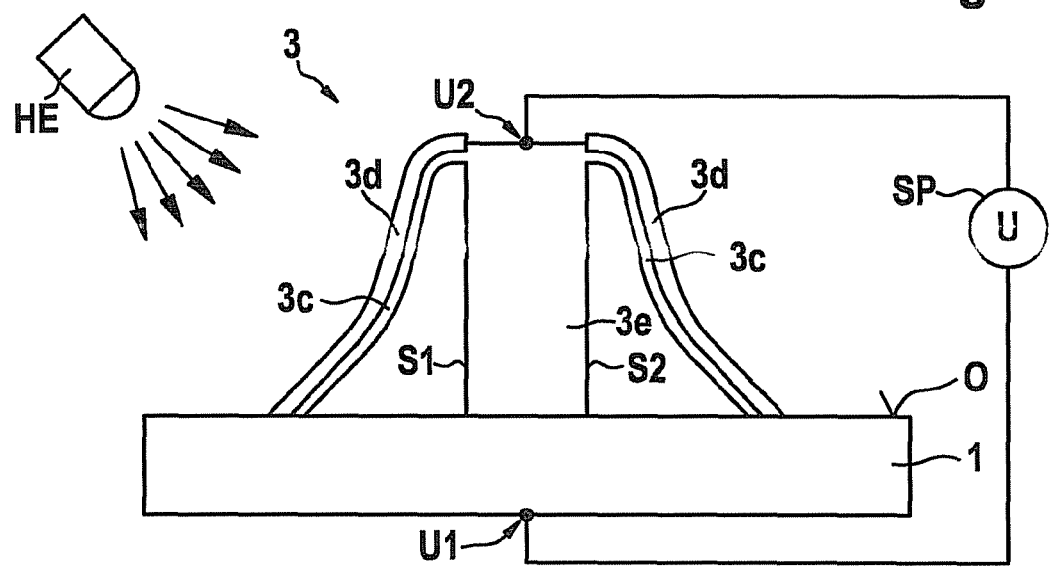
FIG. 4 shows a schematic cross-sectional view of a micromechanical component according to an example embodiment of the present invention.

FIG. 4 is a schematic cross-sectional view of a micromechanical component according to an example embodiment of the present invention.

In contrast to the example embodiment according to FIG. 1, second anchors 3a, 3b are omitted in the example embodiment according to FIG. 4. In this example embodiment, the outer ends of cantilevers 3c are connected directly to surface O of the substrate by anodic bonding employing voltage source SP.

Although the present invention was described above on the basis of exemplary embodiments, it is not restricted thereto, but rather is modifiable in a plurality of manners.

Although specific T-shaped or gallows-shaped micromechanical components are produced as starting structures for the bending in the above exemplary embodiments, in principle any starting structure having an extension in different directions is possible, so that any component having an inclined structure may be manufactured in a simple manner. In particular, fingers or isolated structures may be manufactured and then deflected by suitable measures. In particular, planar diaphragms may also be deflected and connected if the cantilevers are not bar-shaped but rather planar, for example, structuring being able to be performed after the deflection and connecting as necessary. A part of the curved structure may also be detached from the substrate again by structuring and then relax back into the starting plane.

Although the deflection of the cantilevers is achieved thermally and electrically in the above examples, it may also be additionally or alternatively achieved by further measures, for example, by overpressure or partial vacuum, current, etc., or any combination thereof.

In addition to the described sensors and actuators, inter alia, a possible field of use for the components according to example embodiments of the present invention is head-up displays in the automotive field or mini-projectors in the consumer field. In sensors, there are interesting areas of application in particular in the area of inertial sensors. In microfluidics, in which products for the new markets of life science and medical technology are being evaluated, favorable structures may also be manufactured using the method according to example embodiments of the present invention.

What is claimed is:

1. A micromechanical component, comprising:
    a substrate having a surface and a first connectivity to a voltage source;
    a first anchor provided on the surface of the substrate, having a second connectivity to the voltage source, and extending away from the substrate such that the first anchor has a first side wall and a second side wall, the first and second side walls parallel to each other and perpendicular to the surface of the substrate; and
    two cantilevers provided the first and second side walls of the first anchor and extending away from each other and pointing at an inclination away from the first anchor, wherein a voltage applied from the voltage source to the first and the second connectivities induces the cantilever to bend and touch the substrate and anodically bonds a portion of the cantilever touching the substrate to the substrate.

2. The micromechanical component according to claim 1, wherein the cantilever points at an inclination downward toward the surface of the substrate.

3. The micromechanical component according to claim 1, wherein the cantilever is connected directly to the surface of the substrate.

4. The micromechanical component according to claim 1, wherein the cantilever is indirectly connected to the surface of the substrate via a second anchor.

5. The micromechanical component according to claim 1, wherein the first anchor and the cantilever are implemented in one piece.

6. The micromechanical component according to claim 5, wherein the first anchor and the cantilever are formed of silicon.

7. The micromechanical component according to claim 1, wherein the first anchor and a second anchor are provided spaced apart from one another by an intermediate space on the surface of the substrate, the anchors each being connected by a cantilever to the surface of the substrate, and a suspension for a rotational axis of a rotating bar being attached in the intermediate space.

8. The micromechanical component according to claim 7, wherein the suspension for the rotational axis of the rotating bar is attached to the anchors.

9. The micromechanical component according to claim 1, wherein the cantilever includes a multilayered structure.

10. The micromechanical component according to claim 1, wherein the cantilever is curved.

11. The micromechanical component according to claim 1, wherein the cantilever is bar-shaped or planar.

12. A method for manufacturing a micromechanical component anchor support, comprising:
provoding a substrate having a surface and a first anchor provided on the surface of the substrate and extending away from the substrate;
providing at least one cantilever on a lateral surface of the anchor and pointing laterally away from the lateral surface of the anchor; and
applying a voltage to the surface of the substrate and the first anchor, the applied voltage:
bending the cantilever to point at an inclination away from the anchor and touch the substrate; and
anodically bonding a portion of the cantilever touching the substrate to the substrate.

13. The method according to claim 12, wherein the cantilever has a multilayered structure and the bending includes inducing an internal stress in the multilayered structure.

14. The method according to claim 12, wherein the cantilever is bent pointing at an inclination downward toward the surface of the substrate.

15. The method according to claim 12, wherein the cantilever has a second anchor and is bent such that the second anchor touches the surface of the substrate and is then connected to the surface of the substrate.

* * * * *